(12) United States Patent
Kinoshita et al.

(10) Patent No.: US 10,512,154 B2
(45) Date of Patent: Dec. 17, 2019

(54) GROUNDING STRUCTURE FOR CIRCUIT BOARD

(71) Applicant: Panasonic Intellectual Property Management Co., Ltd., Osaka-shi, Osaka (JP)

(72) Inventors: Manabu Kinoshita, Shiga (JP); Nobuo Shirokawa, Shiga (JP); Haruo Suenaga, Shiga (JP); Hisashi Morikawa, Shiga (JP); Hideaki Moriya, Shiga (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 316 days.

(21) Appl. No.: 14/432,701

(22) PCT Filed: Oct. 2, 2013

(86) PCT No.: PCT/JP2013/005885
§ 371 (c)(1),
(2) Date: Mar. 31, 2015

(87) PCT Pub. No.: WO2014/054282
PCT Pub. Date: Apr. 10, 2014

(65) Prior Publication Data
US 2015/0271910 A1 Sep. 24, 2015

(30) Foreign Application Priority Data

Oct. 3, 2012 (JP) .................. 2012-220892

(51) Int. Cl.
*H05K 1/02* (2006.01)
*H01R 4/34* (2006.01)
*H01R 101/00* (2006.01)

(52) U.S. Cl.
CPC ............. *H05K 1/0215* (2013.01); *H01R 4/34* (2013.01); *H01R 2101/00* (2013.01);
(Continued)

(58) Field of Classification Search
CPC ........ H01R 4/66; H01R 12/58; H05K 1/0215; H05K 2201/10409; H05K 2201/10295
See application file for complete search history.

(56) References Cited

U.S. PATENT DOCUMENTS 6,019,614 A * 2/2000 Baur .................... H05K 9/0039
439/883
6,024,586 A * 2/2000 Kumagai ........... H01R 23/6873
411/163

(Continued)

FOREIGN PATENT DOCUMENTS

CN 1805672 7/2006
JP 1-235171 A 9/1989
(Continued)

OTHER PUBLICATIONS

International Search Report, and English language translation thereof, in corresponding International Application No. PCT/JP2013/005885, dated Dec. 24, 2013, 6 pages.
(Continued)

*Primary Examiner* — Steven T Sawyer
(74) *Attorney, Agent, or Firm* — Brinks Gilson & Lione

(57) ABSTRACT

Since a protruding portion preventing a rotation during screw fastening of a connection member is disposed to engage with a printed circuit board, and a protruded length of the protruding portion is smaller than a thickness of the printed circuit board, a configuration can be achieved such that the protruding portion does not interfere with an earth
(Continued)

member, a bracket, etc., disposed on the back side of the printed circuit board, and the earth member and the bracket can freely be designed.

5 Claims, 3 Drawing Sheets

(52) U.S. Cl.
CPC .............. *H05K 2201/1034* (2013.01); *H05K 2201/10295* (2013.01); *H05K 2201/10409* (2013.01)

(56) References Cited

U.S. PATENT DOCUMENTS

| | | | |
|---|---|---|---|
| 6,344,972 B2* | 2/2002 | Estieule | 361/753 |
| 2005/0079748 A1* | 4/2005 | Kim | H01R 4/66 439/92 |
| 2006/0154498 A1* | 7/2006 | Jeong | H05K 7/142 439/66 |
| 2009/0181563 A1* | 7/2009 | Lin | H05K 1/0215 439/92 |
| 2013/0063921 A1* | 3/2013 | Ito | H05K 7/12 361/807 |

FOREIGN PATENT DOCUMENTS

| | | |
|---|---|---|
| JP | H03-33965 U | 4/1991 |
| JP | 9-237647 A | 9/1997 |
| JP | 2005-115383 A | 4/2005 |
| JP | 2008-112581 A | 5/2008 |
| JP | 2009-252486 A | 10/2009 |

OTHER PUBLICATIONS

International Search Report, and English language translation thereof, in corresponding International Application No. PCT/JP2013/005881, dated Dec. 24, 2013, 6 pages.

International Preliminary Report on Patentability, and English language translation thereof, in corresponding International Application No. PCT/JP2013/005885, dated Apr. 16, 2015, 13 pages.

Office Action in corresponding U.S. Appl. No. 14/432,720, dated Sep. 22, 2015, 10 pages.

International Preliminary Report on Patentability, and English language translation thereof, in corresponding International Application No. PCT/JP2013/005881, dated Apr. 16, 2015, 14 pages.

Office Action and Search Report, and English language translation of Search Report, in corresponding Chinese Application No. 201380051269.6, dated Apr. 25, 2016, 9 pages.

Office Action and Search Report, and English language translation of Search Report, in corresponding Chinese Application No. 201380051324.1, dated Apr. 28, 2016, 10 pages.

* cited by examiner

GROUNDING STRUCTURE FOR CIRCUIT BOARD

This application is a 371 application of PCT/JP2013/005885 having an international filing date of Oct. 2, 2013, which claims priority to JP 2012-220892 filed Oct. 3, 2012, the entire contents of which are incorporated herein by reference.

TECHNICAL FIELD

The present invention relates to a grounding structure for a circuit board.

BACKGROUND ART

With regard to a grounding structure for a circuit board, for example, various structures are conventionally known as a method for connecting an earth of a printed circuit board, for example. For example, as depicted in FIG. 5, a connection lead wire 707 is attached from an earth potential (reference potential terminal) of a printed circuit board 2, and a round (annular) crimped terminal (solderless ring-type terminal) 701 is attached to a tip of the connection lead wire 707 and is connected to an earth member 3 by a screw 4 in a known structure.

However, in such a conventional method for attaching the round crimped terminal 701, the screw 4 may obliquely be driven relative to the crimped terminal 701 and the earth member 3 or the screw may incompletely be fastened due to an insufficient torque force. In such a case, the earth connection (i.e., "grounding") of the printed circuit board 2 may be incomplete.

If the earth connection is incomplete, an electric shock may occur in devices and apparatuses incorporating a printed circuit board. For example, if a printed circuit board is used in a high voltage circuit for a magnetron in a microwave oven that is a microwave heating apparatus and the earth connection of the high voltage circuit is incomplete, an electric discharge may occur between an earth member and a screw or an electric shock may even occur in the case of an electric discharge toward the primary side.

To improve such incomplete earth connection of a printed circuit board, a configuration is proposed that has a connection member 101 attached to the printed circuit board 2 and connected to the earth member 3 by the screw 4 as depicted in FIGS. 6a, 6b (see, e.g., Patent Document 1).

FIG. 6a is a plane view of a connection member of Patent Document 1 viewed from a component mounting surface and FIG. 6b is a cross-sectional view taken along a portion A-A' of FIG. 6a viewed in the direction of arrows.

As depicted in FIGS. 6a and 6b, the grounding structure of Patent Document 1 has the plate-shaped connection member 101 disposed on an upper surface of the printed circuit board 2 such that the connection member 101 is connected to a reference potential terminal 7 of the printed circuit board 2 while the connection member 101 and the printed circuit board 2 are fixed to the earth member 3 (e.g., an earth metal part) by using the screw 4. Protruding portions 101a and 101b protruding toward a back surface of the printed circuit board 2 are formed at respective end portions of the connection member 101, and these two protruding portions are inserted in holes of the printed circuit board 2 to position the connection member 101 relative to the printed circuit board 2. The one protruding portion 101a of the connection member 101 is electrically connected through a solder 5 to the reference potential terminal 7 of the printed circuit board 2. A circular through-hole 101c for allowing penetration of the screw 4A is formed in a center portion of the connection member 101, and a through-hole is also formed in the printed circuit board 2. The earth member 3 is fixed to a bracket 6, for example.

Since the plate-shaped connection member 101 can certainly be positioned relative to the printed circuit board 2 by using the two protruding portions 101a, 101b disposed on the connection member 101 in the grounding structure of Patent Document 1 as described above, the connection member 101 does not rotate during fastening by the screw 4 and the screw fastening can certainly be performed to achieve safe earth connection.

Patent Document 1: JP H1-235171 A

SUMMARY OF THE INVENTION

Problem to Be Solved by the Invention

Since further miniaturization of various devices and apparatuses incorporating such a printed circuit board is recently desired, space must efficiently be utilized inside the apparatuses, etc., and a distance tends to decrease between various adjacent components.

However, in the conventional grounding structure of Patent Document 1, as depicted in FIG. 6b, the protruding portion 101b of the connection member 101 is formed with a protruding length exceeding the thickness of the printed circuit board 2 to penetrate the printed circuit board 2 and, therefore, the protruding portion 101b of the connection member 101 interferes with components disposed on the back side of the printed circuit board 2, such as the earth member 3 and the bracket 6. This leads to a problem that the earth member 3 and the bracket 6 must be designed so as not to interfere with the protruding portion 101b of the connection member 101. Particularly, as a distance decreases between various adjacent components so as to efficiently utilize space inside the apparatuses, etc., such a problem becomes more significant.

The present invention was conceived in view of such a conventional problem and it is therefore an object of the present invention to provide a grounding structure for a circuit board capable of restraining a connection member from interfering with an earth member, etc., to increase a degree of freedom in design of the earth member, etc., in a grounding structure for a circuit board using the connection member having a rotation-preventing function due to rotation of a screw.

Means for Solving the Problem

In accomplishing the above objective, according to a present invention, there is provided a grounding structure for a circuit board comprising: a circuit board having a reference potential terminal; a connection member being a plate-shaped member disposed on one surface of the circuit board, the connection member being electrically connected to the reference potential terminal of the circuit board; an earth member disposed on the other surface side of the circuit board; and a screw engaging with the earth member while penetrating through-holes formed in the connection member and the circuit board so as to fix the connection member and the circuit board to the earth member, the screw electrically connecting the connection member with the earth member, the connecting member having a protruding portion protruding toward the other surface of the circuit board and engaging with the circuit board, the protruding portion having a function for preventing a rotation of the connection member due to rotation of the screw, and a protruded length of the protruding portion being smaller than a thickness of the circuit board.

Effect of the Invention

The present invention can restrain the connection member from interfering with the earth member, etc., to increase a degree of freedom in design of the earth member, etc., in the grounding structure for a circuit board using the connection member having a rotation-preventing function for preventing a rotation due to rotation of the screw.

DETAILED DESCRIPTION OF THE PREFERRED EMBODIMENTS

Figure 1A:
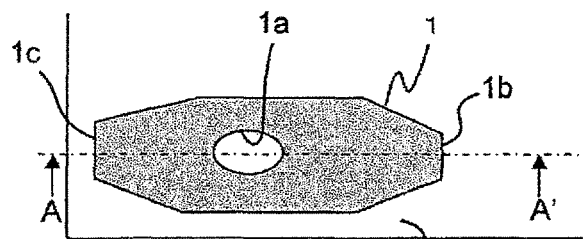
FIG. 1a is a drawing of a grounding structure for a printed circuit board in a first embodiment of the preset invention, and is a plane view of a connection member for the printed circuit board viewed from a component mounting surface.

According to the first invention, there is provided a grounding structure for a circuit board comprising: a circuit board having a reference potential terminal; a connection member being a plate-shaped member disposed on one surface of the circuit board, the connection member being electrically connected to the reference potential terminal of the circuit board; an earth member disposed on the other surface side of the circuit board; and a screw engaging with the earth member while penetrating through-holes formed in the connection member and the circuit board so as to fix the connection member and the circuit board to the earth member, the screw electrically connecting the connection member with the earth member, the connecting member having a protruding portion protruding toward the other surface of the circuit board and engaging with the circuit board, the protruding portion having a function for preventing a rotation of the connection member due to rotation of the screw, and a protruded length of the protruding portion being smaller than a thickness of the circuit board.

With such a configuration, the connection member can be restrained from interfering with the earth member, etc., and a degree of freedom in design of the earth member, etc., can be increased in the grounding structure for a circuit board using the connection member having the rotation-preventing function due to rotation of the screw.

According to the second invention, there is provided the grounding structure according to the first invention, wherein the connection member has a plurality of protruding portions. With such a configuration, since the connection member is engaged at the plurality of protruding portions with the circuit board, an effect to prevent a rotation of the connection member can more certainly be acquired.

According to the third invention, there is provided the grounding structure according to the first or second invention, wherein the through-hole of the connection member is an elongate hole having a width smaller than a diameter of the screw. With such a configuration, since the screw is always in contact with the through-hole of the connection member during screw fastening, the electric contact can certainly be achieved between the connection member and the screw.

According to the fourth invention, there is provided the grounding structure according to any one of the first to third invention, wherein a diameter of the through-hole of the circuit board is larger than a diameter of the screw. With such a configuration, since a shaft portion of the screw can be restrained from coming into contact with the circuit board during screw fastening, the screw can easily be positioned relative to the earth member, and the electric contact can certainly be achieved between the screw and the earth member. Since the screw can be restrained from coming into direct connection with the circuit board during screw fastening, electrode patterns, etc., of the circuit board can be prevented from being damaged.

According to the fifth invention, there is provided the grounding structure according to any one of the first to fourth invention, wherein the connection member is connected only at one position to the reference potential terminal of the circuit board through solder connection. With such a configuration, since an elastic deformation occurs at a position that is not solder-connected during screw fastening in the plate-shaped connection member, the stress to the solder-connected portion can be reduced and the connected portion can be prevented from being damaged due to occurrence of a solder crack, etc.

Embodiments of the present invention will now be described with reference to the drawings. The present invention is not limited to these embodiments.

First Embodiment

Figure 1B:
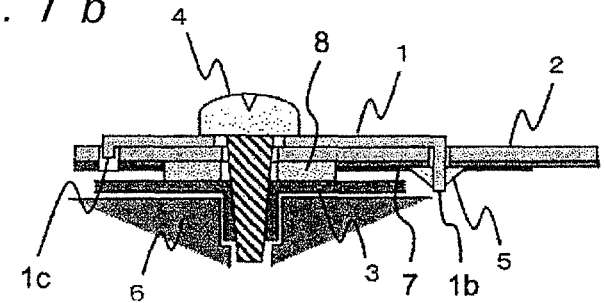
FIG. 1b is a cross-sectional view of the grounding structure taken along a line A-A' of FIG. 1a viewed in the direction of arrows.

FIGS. 1a, 1b are drawings of a grounding structure for a circuit board in a first embodiment of the preset invention; FIG. 1a is a plane view of a connection member for the circuit board viewed from a component mounting surface; and FIG. 1b is a cross-sectional view of the grounding structure taken along a line A-A' of FIG. 1a viewed in the direction of arrows. In FIG. 1a, a screw is not depicted.

As depicted in FIGS. 1a and 1b, the grounding structure for a circuit board in the first embodiment electrically connects, i.e., grounds, a printed circuit board 2 as the circuit board to an earth member 3. Although an example of the printed circuit board 2 used in this description is a circuit board used in high voltage circuits (e.g., 4 kV) such as those used in microwave heating apparatuses represented by a microwave oven, the circuit board is not limited to a circuit board for a high voltage circuit and may be a circuit board for a low voltage circuit, and an apparatus using the circuit board is not limited to a microwave heating apparatus such a microwave oven and may be another apparatus.

The printed circuit board 2 is disposed with a connection member 1 on one surface, i.e., an upper surface side depicted in FIGS. 1a, 1b, and is provided with a reference potential terminal 7 (that may be an electrode pattern) on the other surface, i.e., a lower surface side depicted in FIGS. 1a, 1b. A through-hole 2a for allowing penetration of a screw 4A described later is formed in the printed circuit board 2 (see FIG. 3).

The connection member 1 is, for example, a plate-shaped member having a planar shape elongated in a horizontal direction of FIGS. 1a, 1b and is made of a conductive material (e.g., conductive metal). A through-hole 1a for allowing penetration of the screw 4 described later is formed in a center portion of the connection member 1. As depicted in FIG. 1b, protruding portions 1b, 1c protruding toward the lower surface side of the printed circuit board 2 are formed at respective end portions of the connection member 1.

The one protruding portion 1b penetrates through a through-hole formed in the printed circuit board 2 in the thickness direction and is electrically connected via a solder 5 to the reference potential terminal 7 disposed on the lower surface side of the printed circuit board 2. The other protruding portion 1c protrudes toward the lower surface in a through-hole formed in the printed circuit board 2 and engages with the printed circuit board 2. These protruding portions 1b, 1c have a function for positioning the connection member 1 relative to the printed circuit board 2 and, particularly, the protruding portion 1c has a function for preventing the connection member 1 from rotating relative to the printed circuit board 2 during screw fastening (a rotation-preventing function). As depicted in FIG. 1b, a protruded length of the protruding portion 1c is set a length equal to or smaller than a thickness of the printed circuit board 2. That is, a tip of the protruding portion 1c of the connection member 1 engages with the printed circuit board 2 so as not to protrude from the lower surface of the printed circuit board 2.

The earth member 3 is disposed near the printed circuit board 2 on the lower surface side of the printed circuit board 2 and is fixed to a bracket 6. The earth member 3 is made of a conductive material (e.g., conductive metal) and is electrically connected to an earth outside the apparatus incorporating the printed circuit board 2.

The screw 4 is made of a conductive material (e.g., conductive metal). The screw 4 is engaged at a thread portion formed on a shaft portion thereof with the earth member 3 while penetrating through the through-hole 1a of the connection member 1 and the through-hole 2a of the printed circuit board 2, thereby fixing the connection member 1 and the printed circuit board 2 to the earth member 3 (i.e., the bracket 6) and electrically connecting the screw 4 and the earth member 3.

Figure 2:
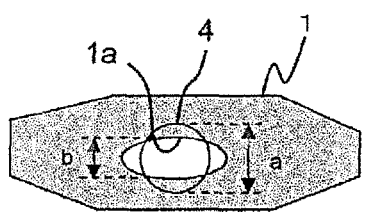
FIG. 2 is a plane view of a shape of a through-hole of the connection member in the first embodiment.

As depicted in FIG. 2, the through-hole 1a formed in the center portion of the connection member 1 is formed as an elongate hole having a width smaller than the diameter of the screw 4. Specifically, a width dimension 'b' (a shorter width dimension) of the elongate hole (the through-hole 1a) of the connection member 1 is set smaller than a diameter dimension 'a' of the screw 4 (i.e., set to satisfy a>b).

Figure 3:
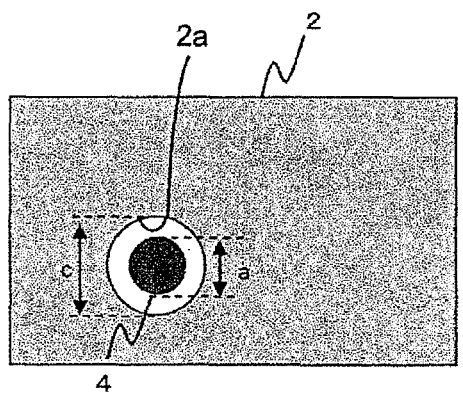
FIG. 3 is a plane view of a shape of a through-hole of the printed circuit board in the first embodiment.

As depicted in FIG. 3, the through-hole 2a formed in the printed circuit board 2 is formed larger than the diameter of the screw 4. Specifically, a diameter dimension 'c' of the through-hole 2a of the printed circuit board 2 is set larger than the diameter dimension 'a' of the screw 4 (i.e., set to satisfy c>a).

As depicted in FIG. 1b, a solder 8 is disposed on a peripheral edge portion of the through-hole 2a on the lower surface side of the printed circuit board 2 and this solder 8 is electrically connected to the reference potential terminal 7 of the printed circuit board 2. The solder 8 of the printed circuit board 2 is pressed against the earth member 3 by screw fastening, and a solder portion and the earth member 3 are electrically connected.

In the grounding structure of the printed circuit board 2 in the first embodiment as described above, the reference potential terminal 7 of the printed circuit board 2 is electrically connected to the protruding portion 1b of the connection member 1 by the solder 5, and the connection member 1 is electrically connected via the screw 4 to the earth member 3. As a result, the reference potential terminal 7 of the printed circuit board 2 is electrically connected, i.e., grounded to the earth member 3.

The reference potential terminal 7 of the printed circuit board 2 is electrically connected to the solder 8 disposed on the peripheral edge portion of the through-hole 2a of the printed circuit board 2 and the solder 8 is electrically connected to the earth member 3 in a pressed state. As a result, the reference potential terminal 7 of the printed circuit board 2 is electrically connected, i.e., grounded to the earth member 3.

As described above, since the reference potential terminal 7 of the printed circuit board 2 is grounded through two routes (dual routes) to the earth member 3 in the grounding structure of the first embodiment, the grounding can more safely be achieved.

Since the plate-shaped connection member 1 is provided with the protruding portions 1b and 1c, the connection member 1 can certainly and easily be positioned relative to the printed circuit board 2. Particularly, since the protruding portion 1c is disposed that is not directly solder-connected to the reference potential terminal 7 and the protruding portion 1c is engaged with the end surface 2b of the printed circuit board 2, the connection member 1 can be prevented from rotating relative to the printed circuit board 2 (a rotation can be prevented) during screw fastening. Since the stress applied via the screw 4 to the connection member 1 during screw fastening can be distributed to a plurality of the protruding portions 1b and 1c, the stress to the solder-connected protruding portion 1b can be reduced to prevent damage to the connected portion (e.g., occurrence of a solder crack). The shape of the connection member 1 itself can be restrained from deforming due to the stress and the grounding can stably be achieved.

The connection member 1 is provided with the protruding portion 1c having a rotation-preventing function for preventing a rotation during screw fastening such that the protruding portion 1c is engaged with the printed circuit board 2. The protruded length of the protruding portion 1c is smaller than the thickness of the printed circuit board 2, and the tip of the protruding portion 1c does not protrude from the lower surface of the printed circuit board 2 in the engaged state. Since the protruding portion 1c is disposed in this way, the protruding portion 1c can be prevented from interfering with various components disposed on the lower surface side of the printed circuit board 2. Therefore, the protruding portion 1c does not interfere with the earth member 3 and the bracket 6 disposed on the lower surface side of the printed circuit board 2 in this configuration, and the earth member 3 and the bracket 6 can freely be designed.

The connection member 1 is solder-connected only at one position of protruding portion 1b by the solder 5 and the protruding portion 1c is not solder-connected. Therefore, since an elastic deformation occurs at a position that is not solder-connected during screw fastening in the connection member 1, the stress to the solder-connected portion can be reduced and the connected portion can be prevented from being damaged due to occurrence of a solder crack, etc.

Since the through-hole 1a of the connection member 1 for attaching the screw 4 is an elongate hole and the width dimension of the elongate hole 1a is configured smaller than the diameter of the screw 4, the screw 4 cuts into the connection member 1 so that the connection member 1 and the screw 4 can always be brought into contact with each other. Therefore, the electric connection between the connection member 1 and the screw 4 can be made more stable. Particularly, even when the screw 4 is obliquely driven relative to the connection member 1 and the screw may incompletely be fastened due to an insufficient torque force during screw fastening, the grounding can safely be achieved.

The hole diameter of the through-hole 2a of the printed circuit board 2 is configured larger than the diameter of the screw 4. Since this configuration can prevent the screw 4 from coming into contact with the printed circuit board 2 during screw fastening, an unnecessary stress applied to the connection member 1 and the solders 5, 8 can be suppressed. Particularly, the electrode patterns, etc., of the reference potential terminal 7 of the printed circuit board 2 can be prevented from being damaged. Additionally, the screw 4 can more easily positioned relative to the earth member 3 (or the bracket 6) disposed on the lower side of the printed circuit board 2 during screw fastening and the electric contact can certainly be achieved between the screw 4 and the earth member 3.

Second Embodiment 2

Figure 4:
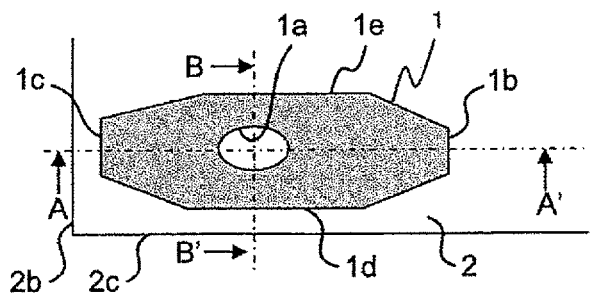
FIG. 4a is a drawing of a grounding structure of a printed circuit board in a second embodiment of the preset invention, and is a plane view of a connection member for the printed circuit board viewed from a component mounting surface.
FIG. 4b is a cross-sectional view of the grounding structure taken along a line A-A' of FIG. 4a viewed in the direction of arrows.
FIG. 4c is a cross-sectional view of the grounding structure taken along a line B-B' of FIG. 4a viewed in the direction of arrows.
Figure 4:
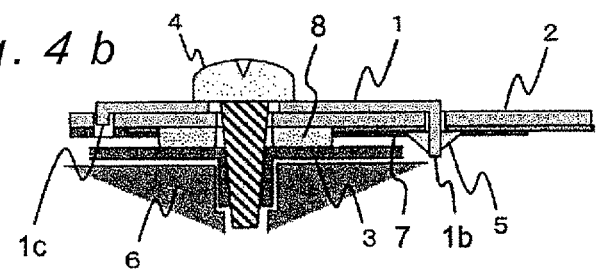
Figure 4:
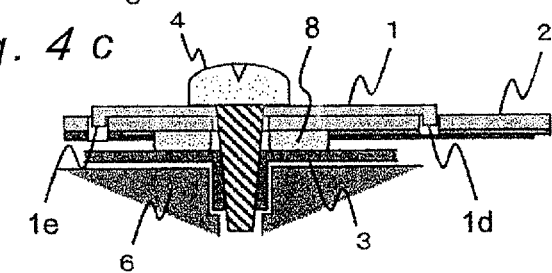
Figure 5:
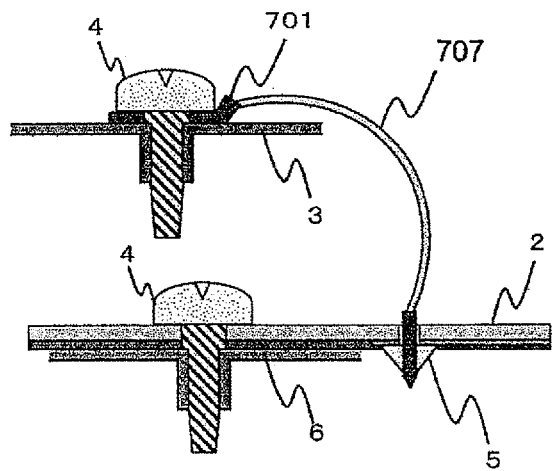
FIG. 5 is a configuration diagram of a conventional grounding structure of a printed circuit board.
Figure 6A:
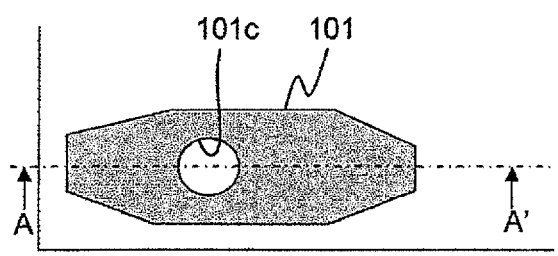
FIG. 6a is a configuration diagram of a conventional grounding structure of a printed circuit board.
Figure 6B:
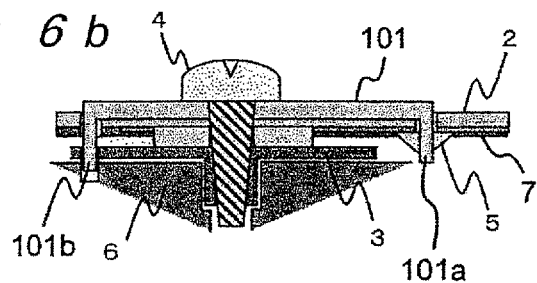
FIG. 6b is a configuration diagram of a conventional grounding structure of a printed circuit board.

FIGS. 4a, 4b and 4c are drawings of a grounding structure for a circuit board in a second embodiment of the preset invention; FIG. 4a is a plane view of a connection member for the circuit board viewed from a component mounting surface; FIG. 4b is a cross-sectional view of the grounding structure taken along a line A-A' of FIG. 4a viewed in the direction of arrows; and FIG. 4c is a cross-sectional view of the grounding structure taken along a line B-B' of FIG. 4a viewed in the direction of arrows. In FIG. 4a, a screw is not depicted. In the second embodiment, the same constituent members as those of the grounding structure of the first embodiment described above are denoted by the safe reference numerals and will not be described. A configuration different from the grounding structure of the first embodiment described above will hereinafter be described.

In the grounding structure for a circuit board of the second embodiment, the connection member 1 is further additionally provided with a protruding portion having the rotation-preventing function without being solder-connected, that is, provided with a total of 3 protruding portions 1c, 1d and 1e. Specifically, as depicted in FIG. 4b, the connection member 1 includes the protruding portion 1c (a first protruding portion) which is provided adjacent to the end surface 2b of the printed circuit board 2 and which is engaged with the printed circuit board 2. As depicted in FIG. 4c, the connection member 1 also includes a protruding portion 1d (a second protruding portion) which is provided adjacent to an end surface 2c extending in a direction different from the first end surface 2b of the printed circuit board 2 (i.e., extending in the horizontal direction of FIG. 4a) and which is engaged with the printed circuit board 2. Further, the connection member 1 includes a protruding portion 1e (a third protruding portion) which is provided at an end portion on the opposite side from an end portion at which the protruding portion 1d is provided and which is engaged with the printed circuit board 2.

Since this configuration increases the positions supporting the connection member 1 against the rotation direction of the screw 4 during screw fastening, the stress to the connection member 1 and the solders 5, 8 can be suppressed.

As depicted in FIGS. 4b and 4c, the protruding length of the protruding portions 1c, 1d and 1e of the connection member 1 is set to a dimension equal to or less than the thickness of the printed circuit board 2. Therefore, the protruding portions 1c, 1d and 1e can be restrained from interfering with the earth member 3 and the earth member 3 can be designed with an increased degree of freedom.

Although in the above-described embodiments it has been explained as one embodiment that the through-hole is formed in the printed circuit board 2 and the protruding portion 1c (1d) is inserted into the through-hole thereby engaging with the printed circuit board 2, the present disclosure is not limited to such a case. For example, a recessed portion may be provided in the upper surface of the printed circuit board 2, and the protruding portion 1c (1d) may be inserted into the recessed portion thereby engaging with the printed circuit board 2.

Any embodiments of the various embodiments described above can be combined to produce the effects of the respective embodiments.

Although the embodiments of the present invention have been described, the present invention is not limited to the items described in the embodiments, and modification and application thereof achieved by those skilled in the art based on derails of the description and well-known techniques are intended by the present invention and are included in the scope of the protection sought.

INDUSTRIAL AVAILABILITY

As described above, a protruding portion of a connection member acting as a rotation-stop for a circuit board is disposed to engage with the circuit board, and a protruded length of the protruding portion is smaller than a thickness of the circuit board. Thereby, the grounding structure for the circuit board of the present invention is configured such that the protruding portion does not interfere with components such as an earth member disposed on the side opposite to the connection member relative to the circuit board and, therefore, the components such as the earth member can freely be designed.

What is claimed is:
1. A grounding structure for a circuit board comprising:
a circuit board having a reference potential terminal on a lower surface thereof and a plurality of through-holes therein;
a plate-shaped connection member on an upper surface of the circuit board and having a through-hole therein, the connection member electrically connected to the reference potential terminal of the circuit board;
an earth member below a lower surface of the circuit board; and
a screw engaging with the earth member and penetrating the through-holes in the connection member and the circuit board so as to fix the connection member and the circuit board to the earth member, the screw electrically connecting the connection member with the earth member, the connection member having first and second protruding portions protruding toward the lower surface of the circuit board and engaging with the circuit board, the first protruding portion preventing rotation of the connection member due to rotation of the screw, and wherein a protruded length of the first protruding portion is smaller than a thickness of the circuit board, and the first protruding portion is provided adjacent to an end surface of the circuit board, and the connection member is directly connected to the reference potential terminal of the circuit board only by a solder connection to the second protruding portion.

2. The grounding structure according to claim 1, wherein the through-hole of the connection member is an elongate hole having a width smaller than a diameter of the screw.

3. The grounding structure according to claim 1, wherein a diameter of the through-hole of the circuit board is larger than a diameter of the screw.

4. The grounding structure according to claim 1, wherein the first protruding portion and the second protruding portion are at respective outer end portions of the connecting member.

5. The grounding structure according to claim 1, wherein the first protruding portion and the second protruding portion are at positions distantly spaced away from a region between a head of the screw and the connecting member.

* * * * *

UNITED STATES PATENT AND TRADEMARK OFFICE
CERTIFICATE OF CORRECTION

PATENT NO. : 10,512,154 B2
APPLICATION NO. : 14/432701
DATED : December 17, 2019
INVENTOR(S) : Manabu Kinoshita et al.

Page 1 of 1

It is certified that error appears in the above-identified patent and that said Letters Patent is hereby corrected as shown below:

On the Title Page

Left column, item (72), after "Haruo Suenaga," replace "Shiga (JP)" with -- Osaka (JP) --.

Signed and Sealed this
Twenty-eighth Day of April, 2020

Andrei Iancu
*Director of the United States Patent and Trademark Office*